(12) United States Patent
Minamikawa

(10) Patent No.: US 8,831,458 B2
(45) Date of Patent: Sep. 9, 2014

(54) IMAGE FORMING APPARATUS

(75) Inventor: Shunsuke Minamikawa, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 742 days.

(21) Appl. No.: 12/730,480

(22) Filed: Mar. 24, 2010

(65) Prior Publication Data

US 2010/0316406 A1 Dec. 16, 2010

(30) Foreign Application Priority Data

Jun. 12, 2009 (JP) ................................. 2009-141024

(51) Int. Cl.
*G03G 15/00* (2006.01)
*G11C 27/00* (2006.01)
*G11B 7/00* (2006.01)
*G06F 3/12* (2006.01)
*G03G 15/23* (2006.01)

(52) U.S. Cl.
CPC .............. *G03G 15/234* (2013.01); *G03G 15/50* (2013.01)
USPC ................. 399/83; 399/10; 365/48; 369/125; 358/1.15; 358/1.1

(58) Field of Classification Search
None
See application file for complete search history.

(56) References Cited

U.S. PATENT DOCUMENTS

| | | | | |
|---|---|---|---|---|
| 2004/0120003 A1* | 6/2004 | Barry et al. | | 358/1.15 |
| 2008/0037058 A1* | 2/2008 | Ban | | 358/1.15 |
| 2008/0297838 A1* | 12/2008 | Matsui et al. | | 358/1.15 |
| 2009/0190147 A1 | 7/2009 | Uruta et al. | | |

FOREIGN PATENT DOCUMENTS

| | | | |
|---|---|---|---|
| JP | 4-117057 | | 4/1992 |
| JP | 8-52907 | A | 2/1996 |
| JP | 8-97983 | | 4/1996 |
| JP | 8-328320 | | 12/1996 |
| JP | 9-244510 | A | 9/1997 |
| JP | 11-133678 | | 5/1999 |
| JP | 11-160919 | A | 6/1999 |
| JP | 11-284818 | A | 10/1999 |
| JP | 2000-94803 | A | 4/2000 |
| JP | 2002-117399 | | 4/2002 |
| JP | 2003-11473 | | 1/2003 |
| JP | 2004-192319 | | 7/2004 |
| JP | 2009-172805 | | 8/2009 |

OTHER PUBLICATIONS

Chinese Office Action dated Apr. 28, 2012 from related Chinese Application No. 201010148826.4 together with an English language translation.
Japanese Official Action dated Apr. 19, 2011 together with an English language translation from JP 2009-141024.

* cited by examiner

*Primary Examiner* — Marcus T Riley
(74) *Attorney, Agent, or Firm* — Scully, Scott, Murphy & Presser, PC

(57) ABSTRACT

An image forming apparatus is provided. The image forming apparatus includes: a storage section configured to store data; a printing section configured to perform duplex printing of the data stored in the storage section, the duplex printing including printing N sheets on first sides thereof and subsequently printing M sheets on second sides thereof, wherein M is equal to or smaller than N; a detection section configured to detect a request for storing data in the storage section; and a changing section configured to change the value of N into a smaller value during the duplex printing, in response to the detection of the request for storing data based on a function which uses the storage section concurrently with an operation of the duplex printing.

10 Claims, 7 Drawing Sheets

FIG. 6

321

| FUNCTION CONTENTS | N |
|---|---|
| HIGH-RESOLUTION SCANNING | 1 |
| STANDARD SCANNING | 2 |
| LOW-RESOLUTION SCANNING | 3 |

IMAGE FORMING APPARATUS

CROSS-REFERENCE TO RELATED APPLICATION

This application claims priority from Japanese Patent Application No. 2009-141024, filed on Jun. 12, 2009, the entire subject matter of which is incorporated herein by reference.

TECHNICAL FIELD

Aspects of the present invention relate to an image forming apparatus capable of duplex printing, and more particularly, to an image forming apparatus capable of duplex printing by printing a plurality of sheets on first sides thereof and subsequently printing the sheets on second sides thereof.

BACKGROUND

There has been proposed a technique (referred to as "a high-speed duplex printing") for improving a speed of the duplex printing process by printing N sheets (N is a positive integer) on the first side thereof and subsequently printing M sheets (M is an integer equal to or more than 0 and equal to or less than N) on the second sides thereof. For example, for performing duplex printing on 10 pages (5 sheets), an image forming apparatus prints them in the page order of 2 (even page), 4 (even page), 1 (odd page), 6 (even page), 3 (odd page), 8 (even page), 5 (odd page), 10 (even page), 7 (odd page), and 9 (odd page). Furthermore, an image forming apparatus prints them in the page order of 1, 3, 5, 2, 7, 4, 9, 6, 8, and 10.

However, in the above-described duplex printing technique, there have been the following problems. That is, in the duplex printing, in order to prepare for a retry process in the case of a paper jam, the print data for the first side is not deleted until at least the printing on the second side is completed even after the printing on the first side is completed. Therefore, if the printing speed is increased by increasing the number of sheets N to be successively printed on the first side, the amount of memory used is likely to increase. Accordingly, such during high-speed duplex printing, another function may be restricted since the available amount of memory is not sufficient.

SUMMARY

Accordingly, it is an aspect of the present invention to provide an image forming apparatus capable of appropriately operating high-speed duplex printing while reducing the restriction on another function.

According to an illustrative embodiment of the present invention, there is provided an image forming apparatus comprising: a storage section configured to store data; a printing section configured to perform duplex printing of the data stored in the storage section, the duplex printing including printing N sheets on first sides thereof and subsequently printing M sheets on second sides thereof, wherein M is equal to or smaller than N; a detection section configured to detect a request for storing data in the storage section; and a changing section configured to change the value of N into a smaller value during the duplex printing, in response to the detection of the request for storing data based on a function which uses the storage section concurrently with an operation of the duplex printing.

According to another illustrative embodiment of the present invention, there is provided an image forming apparatus comprising: a reading section configured to read an original document; a storage section configured to store at least one of data read by the reading section and data received from an external device; a printing section configured to perform duplex printing of the data stored in the storage section, the duplex printing including printing N sheets on first sides thereof and subsequently printing M sheets on second sides thereof, wherein M is equal to or smaller than N; a changing section configured to change the value of N into a smaller value during the duplex printing, in response to that at least a part of operation for executing reading operation by the reading section is performed; and a control section configured to control the printing section to perform the duplex printing in accordance with the value of N.

According to the above-described illustrative embodiments, it is possible to provide an image forming apparatus capable of appropriately operating high-speed duplex printing while reducing the restriction on another function.

BRIEF DESCRIPTION OF THE DRAWINGS

The above and other aspects of the present invention will become more apparent and more readily appreciated from the following description of illustrative embodiments of the present invention taken in conjunction with the attached drawings, in which:

FIG. 6 is a diagram illustrating an example of an N changing table; and

DETAILED DESCRIPTION

Hereinafter, an image forming apparatus according to an illustrative embodiment of the present invention will be described in detail with reference to the accompanying drawings. In the illustrative embodiment, there will be described an electrophotographic color printer as an example of the image forming apparatus. The color printer is capable of duplex printing by printing a plurality of sheets on the first sides thereof and subsequently printing the sheets on the second sides thereof.

[Overall Configuration of Printer]

Figure 1:
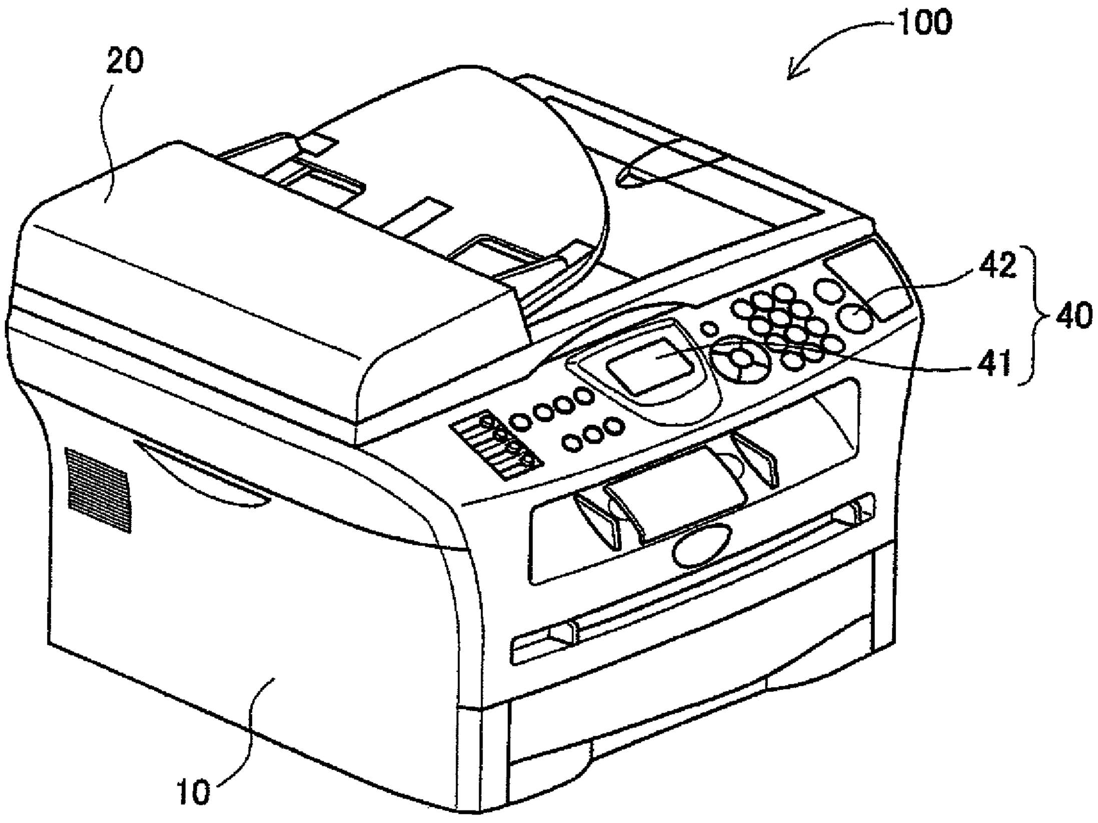
FIG. 1 is a perspective view illustrating a schematic configuration of a printer according to an illustrative embodiment.

As shown in FIG. 1, a printer 100 according to an illustrative embodiment includes an image forming section 10 that forms an image on a sheet and an image reading section 20 that reads an image of an original document. On the front side of the image reading section 20, there is provided an operation panel 40 including a display section 41 that is configured as a liquid crystal display, and a button group 42 that includes a start key, a stop key, a numeric keypad, and the like. The operation panel 40 is configured to display an operation status of the printer 100 and allow a user to perform an input operation.

[Configuration of Image Forming Section of Printer]

Figure 2:
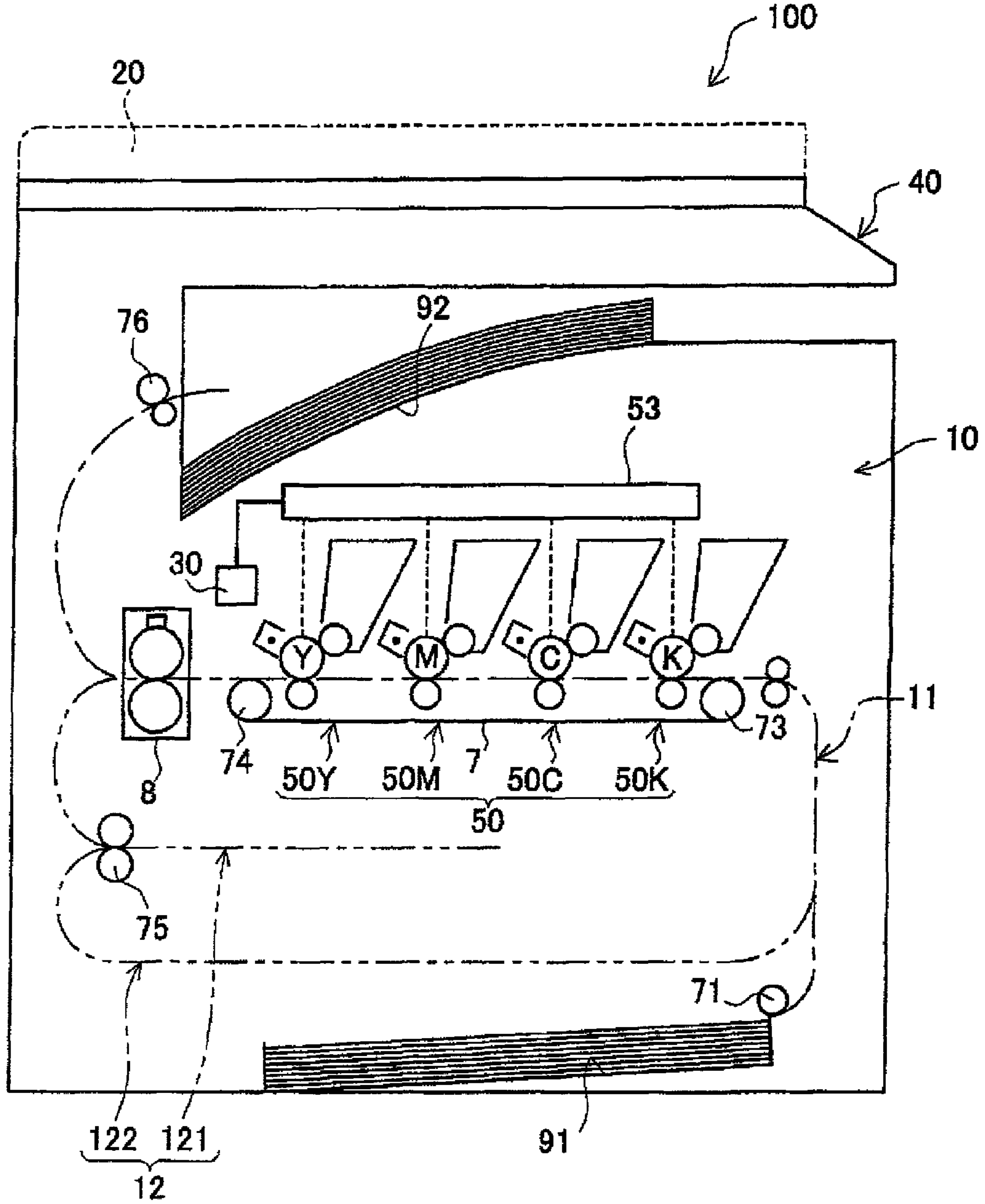
FIG. 2 is a conceptual diagram illustrating an internal configuration of an image forming section of the printer shown in FIG. 1.

As shown in FIG. 2, the image forming section 10 includes a processing section 50 that forms a toner image and transfers the toner image on a sheet, a fixing unit 8 that fixes the unfixed toner on the sheet, a sheet feeding cassette 91 that accommodates sheets on which an image has not been formed yet, and a sheet discharging tray 92 that receives sheets on which an image has been formed. Further, in the image forming section 10, a substantially S-shaped conveying path 11 (the chain line shown in FIG. 2) is provided. Along the conveying path 11, a sheet accommodated in the sheet feeding cassette 91 which is located on the bottom portion of the image forming section 10 is passed through a sheet feeding roller 71, the processing section 50, and the fixing unit 8, and is discharged by a sheet discharging roller 76 to the sheet discharging tray 92 which is located on the upper portion of the image forming section 10.

The processing section 50 is capable of forming a color image, and includes four processing units corresponding to the respective colors of yellow (Y), magenta (M), cyan (C), and black (K) which are arranged in parallel. Specifically, the processing section 50 includes a processing unit 50Y that forms a yellow (Y) image, a processing unit 50M that forms a magenta (M) image, a processing unit 50C that forms a cyan (C) image, and a processing unit 50K that forms a black (K) image. The processing section 50 further includes an exposure unit 53 that illuminates light on the respective processing units 50Y, 50M, 50C, and 50K, and a conveying belt 7 that is looped between the rollers 73 and 74 and that conveys a sheet to the transfer positions of the respective processing units 50Y, 50M, 50C, and 50K. Each of the processing units 50K, 50Y, 50M, and 50C is configured to form a toner image by an electrophotographic method.

The image forming section 10 feeds the sheets accommodated on the sheet feeding cassette 91 one by one, conveys the fed sheet to the processing section 50, and transfers the toner images formed by the processing section 50 onto the sheet. Furthermore, the sheet onto which the toner images are transferred is conveyed into the fixing unit 8, and the toner images are thermally fixed on the sheet. Then, the fixed sheet is discharged to the sheet discharging tray 92.

Furthermore, the image forming section 10 has a duplex printing mechanism that prints both sides (first side and second side) of a sheet. As shown in FIG. 2, a conveying path 12 (the chain double-dashed line in FIG. 2) is used for reversing the sheet and conveying the sheet again to the processing section 50 so as to perform printing on the back side (the second side) of the sheet printed on one side (the first side). The conveying path 12 branches from the conveying path 11 at a position at a downstream side from the fixing unit 8 in a sheet conveying direction. The conveying path 12 includes a conveying path 121 (hereinafter referred to as a "temporary staying path 121") for temporarily allowing the sheet to stay in order to reverse the sheet conveying direction and a conveying path 122 (hereinafter referred to as a "returning path 122") for returning the reversed sheet to the conveying path 11.

Specifically, in the duplex printing performed by the image forming section 10, the sheet is reversed in the following procedure. First, the sheet which is passed through the conveying path 11 (hereinafter referred to as a "forward conveying path 11") and has an image formed on the first side thereof, is thermally fixed by the fixing unit 8, and is subsequently sent to the conveying path 12 (hereinafter referred to as a "reverse conveying path 12"). Then, the sheet is conveyed into the temporary staying path 121, and the conveyance of the sheet is temporarily suspended. Thereafter, by turning the rotation direction of the turning roller 75, the sheet conveying direction is reversed, and the sheet is conveyed into the returning path 122. Then, the sheet is returned to the forward conveying path 11 at an upstream side from the processing section 50. Accordingly, the sheet is reversed, and an image is formed on the second side.

The image forming section 10 has a function of successively printing N sheets (N is a positive integer) on the first sides thereof and subsequently printing M sheets (M is an integer equal to or more than 0 and equal to or less than N) on the second sides thereof at the time of performing the duplex printing. Furthermore, the image forming section 10 has a function of changing the number of sheets N and the number of sheets M to be successively printed. The change of N and M is performed by adjusting the timing of sheet conveyance and the conveying speed. In this illustrative embodiment, the value of N is set to 3 as a default value (original value). The value of N and the value of M are appropriately changed by an interruption process to be described later.

For example, when the number of sheets N to be successively printed is 3, the sheets are conveyed in the following procedure. First, the first sheet S1 is conveyed into the forward conveying path 11, and is printed on the first side thereof. Next, while the sheet S1 is conveyed into the temporary staying path 121, the second sheet S2 is conveyed into the forward conveying path 11, and is printed on the first side thereof Subsequently, the sheet S1 is conveyed into the returning path 122, the sheet S2 is conveyed into the temporary staying path 121, and the third sheet S3 is conveyed into the forward conveying path 11. Then, the sheet S3 is printed on the first side thereof. In this state, the sheet S1 is caused to stay in the reverse conveying path 12 (being conveyed in the reverse conveying path 12), and is not returned to the forward conveying path 11. That is, two sheets are staying in the reverse conveying path 12. Thereafter, in order of the sheets S1, S2, and S3, the sheets are returned to the forward conveying path 11, and are printed on the second sides thereof. Consequently, the printing is performed in order of the first side of the first sheet, the first side of the second sheet, the first side of the third sheet, the second side of the first sheet, the second side of the second sheet, and the second side of the third sheet. This conveying order allows the standby time of the processing section 50 to be shorter as compared with the case where the printing is performed on a sheet in order of the first side and second side on a sheet-by-sheet basis, so that printing efficiency can be improved.

It is noted that the maximum number of sheets N to be successively printed is different depending on the number of sheets capable of staying in the reverse conveying path 12. The number of sheets capable of staying in the reverse conveying path 12 depends on the length of the reverse conveying path 12, the length of the sheet in the sheet conveying direction, and the like. That is, the number of sheets N to be successively printed is not limited to 3 described above, but may be 2, or 4 or more.

[Electric Configuration of Printer]

Figure 3:
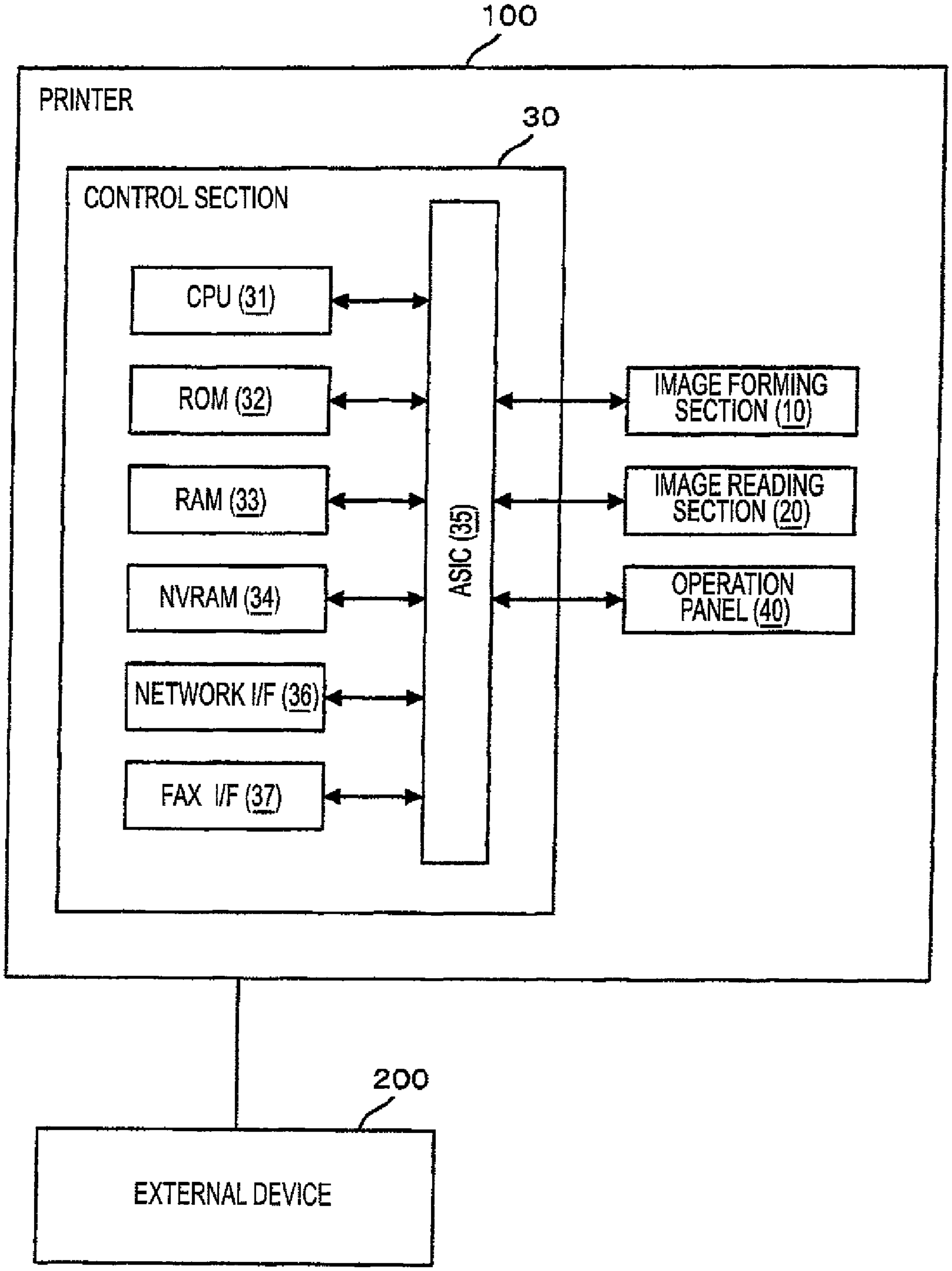
FIG. 3 is a block diagram illustrating an electric configuration of the printer.

Subsequently, an electric configuration of the printer 100 will be described. As shown in FIG. 3, the printer 100 includes a control section 30. The control section 30 includes a Central Processing Unit (CPU) 31, a Read Only Memory (ROM) 32, a Random Access Memory (RAM) 33, a nonvolatile RAM (NVRAM) 34, an Application Specific Integrated Circuit (ASIC) 35, a network interface 36, and a FAX interface 37.

Furthermore, the control section 30 is electrically connected to the image forming section 10, the image reading section 20, and the operation panel 40.

The ROM 32 stores various control programs and various settings for controlling the printer 100, initial values, and the like. The RAM 33 is used as a work area, from which the various control programs are read, or as a storage area which temporarily stores image data.

The CPU 31 stores the processing result in the RAM 33 or the NVRAM 34 according to signals transmitted from various sensors and the control program read from the ROM 32, and controls various elements of the printer 100 through the ASIC 35 (for example, lighting timing of the exposure device 53, drive motors (not shown) of the various rollers constituting the forward conveying path 11 and the reverse conveying path 12, and moving motors (not shown) of an image sensor unit constituting the image reading section 20).

The network interface 36 is connected to a network such as the internet to enable a communication with an external device 200 in which a printer driver for the printer 100 is installed. The FAX interface 37 is connected to a public line to enable a FAX communication. The printer 100 is capable of communicating a print job through the network interface 36 or the FAX interface 37.

[Printing Process]

Figure 4:
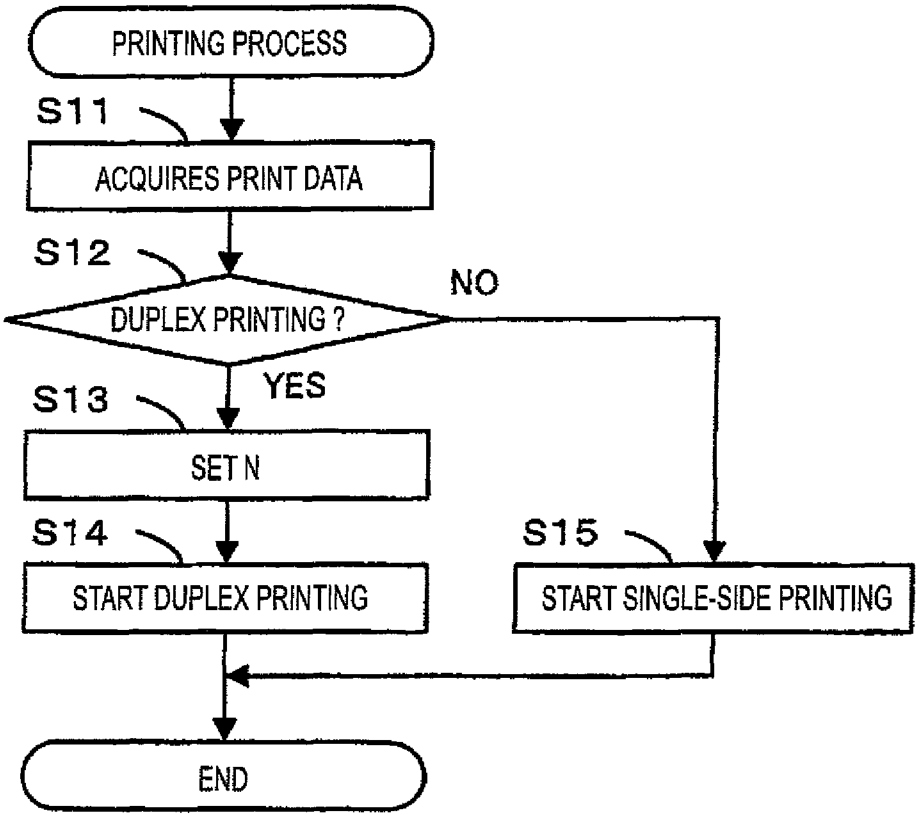
FIG. 4 is a flowchart illustrating a procedure of a printing process.

Hereafter, the printing process of the printer 100 will be described with reference to the flowchart of FIG. 4. The printer 100 performs the printing process in response to a reception of a print job transmitted (communicated) from the external device 200.

First, acquisition of the print data starts (S11). The printer 100 receives the print data in page order, and acquires print-job-attribute information including information on a duplex printing setting as well. The received print data is compressed state, and is stored in the RAM 33.

Next, it is determined whether the received print job is a duplex print job based on the acquired print-job-attribute information (S12). If the received print job is not a duplex print job but a one-side print job (S12: NO), a memory area for expanding image data corresponding to one page is reserved in the RAM 33, and the one-side printing operation starts (S15). In the one-side printing operation, the print data as a printing target is expanded in the reserved memory area, and the expanded print data is deleted from the memory area after completion of the printing. This operation is repeated throughout all the pages. Then, after the printing of all the pages is terminated, the reserved memory area is released, and the one-side printing operation is terminated, so that this printing process is terminated.

If the received print job is the duplex print job (S12: YES), the number of sheets N to be successively printed on the first side is determined (S13). In this illustrative embodiment, as described above, the value of N is set to 3 as a default value. Thereafter, the memory area for expanding image data corresponding to 6 pages (that is, 2×N pages) is reserved in the RAM 33, and the duplex printing operation starts (S14). In the duplex printing operation, the print data as a printing target is expanded in the reserved memory area, and the print data corresponding to both sides is deleted from the memory area after completion of the printing on both sides. Specifically, the print data is not immediately deleted even after the printing on the first side, and the print data for the first side is deleted together with the print data for the second side after the printing on the second side. This operation is repeated throughout all the pages. Then, after the printing of all the pages is terminated, the reserved memory area is released, and the duplex printing operation is terminated, so that this printing process is terminated.

During the duplex printing operation, when an instruction to change N is issued in an interruption process or a panel interruption process (described later), the memory area reserved for the duplex printing operation is temporarily released, and a new value is determined as the value of N. Then, a memory area based on the new value of N is reserved again. For example, if the value of N is changed from 3 into 2, the currently reserved memory area corresponding to 6 pages is released, and a memory area corresponding to 4 pages is newly reserved.

[Interruption Process]

Figure 5:
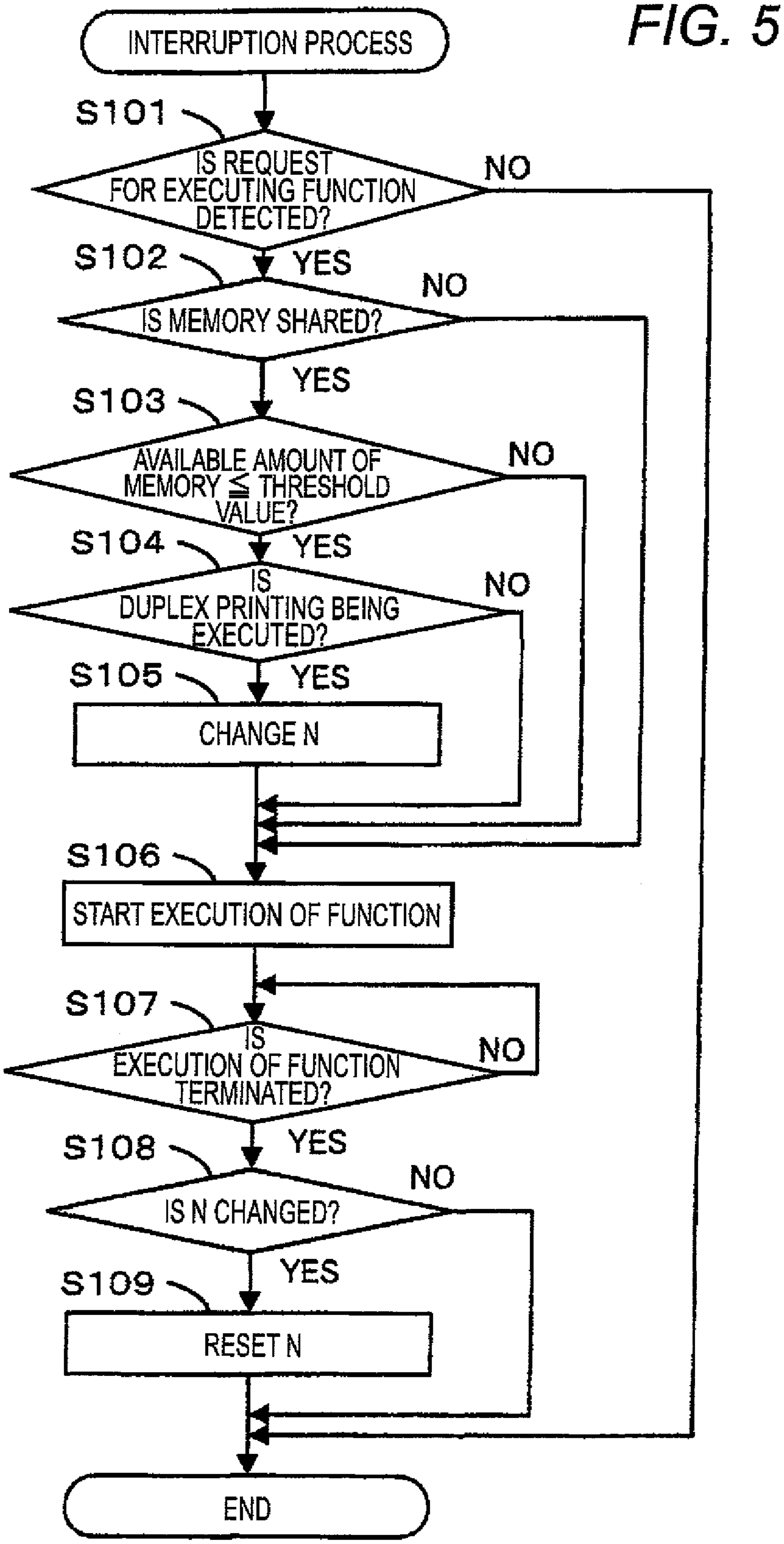
FIG. 5 is a flowchart illustrating a procedure of an interruption process.

Hereafter, the interruption process in the printer 100 will be described with reference to the flowchart of FIG. 5. In the interruption process, in response to a request for executing a function (operation) that can be executed concurrently with (at the same time as) the printing operation, the function is executed. It is noted that the printer 100 executes the interruption process at a predetermined interval.

First, it is determined whether the request for executing a function (for example, scanning of the image reading section 20, transmission/reception of FAX data, transmission/reception of electronic mails, or editing of address book), which can be executed concurrently with the printing operation, is detected (S101). If the request for executing the function which can be executed concurrently with the printing operation is not detected (S101: NO), the process is terminated.

If the request for executing the function which can be operated concurrently with the printing operation is detected (S101: YES), it is determined whether the detected function uses (shares) the common memory area with the printing operation (S102). For example, when the address book is operated by using a memory other than the RAM 33, it is determined that the function of editing the address book does not use the common memory area with the printing operation. If the detected function does not use the common memory area with the printing operation (S102: NO), this function is not affected by the large amount of the memory area used by the high-speed duplex printing. Therefore, the N changing process (S105) is bypassed, and the interruption process proceeds to the operation S106. Then, the function corresponding to the request is executed.

If the detected function uses the common memory area with the printing operation (S102: YES), it is determined whether an available amount of memory is equal to or less than a threshold value (S103). If the capacity of memory is large and there is sufficient available amount, even though the available amount of memory is not enlarged by not changing the value of N, the printing operation has less influence on execution of another function. Therefore, the amount of memory sufficient for executing a function is set as a threshold value in advance, and if the available amount of memory is larger than the threshold value (S103: NO), the N changing process is bypassed. Then, the interruption process proceeds to the operation S106, so that the function corresponding to the request is executed. It is noted that the threshold value may be one fixed value, or may be selected in accordance with the requested function from a plurality of threshold values for respective functions.

If the available amount of memory is equal to or less than the threshold value (S103: YES), it is determined whether the duplex printing operation is being executed (S104). If the duplex printing operation is not being executed (S104: NO), it is not necessary to change the value of N. Therefore, the N changing process is bypassed, and the interruption process proceeds to the operation S106, so that the function corresponding to the request is executed.

If the duplex printing operation is being executed (S104: YES), the value of N is changed in accordance with the function corresponding to the request (S105). The printer 100 stores in the ROM 32 a table which includes a change amount of N for each function. Then, referring to the table, the value of N is determined in accordance with the function corresponding to the request. It is noted that, the table may be for determining the change amount of N according to content of functions.

FIG. 6 shows an example of the N changing table 321 which defines the value of N for a scanning function. As the amount of memory used is larger, the smaller value is set to the value of N. For example, in the N changing table 321 shown in FIG. 6, for the high-resolution scanning which is likely to use a large amount of memory, the value of N is set to 1, so that the amount of memory used for the duplex printing operation can be reduced. For the low-resolution scanning which is likely to use a small amount of memory, the value of N is set to 3. That is, the amount of memory used in the duplex printing operation is not changed. As described above, N may not be changed in accordance with the contents of the function.

After the value of N is changed, the function detected in the operation S101 is executed (S106). The amount of memory for executing the function is reserved due to changing the value of N, or the amount of memory enough to execute the function is originally reserved without changing the value of N. Therefore, the function is less likely to be restricted because of lack of the available amount of memory. On the other hand, in the duplex printing operation, an increase in speed is restricted, but the printing process can be continued.

Next, it is determined whether the execution of the function detected in the operation S101 is terminated (S107). If the execution of the function is not terminated (S107: NO), the process is queued until the execution of the function is terminated. If the execution of the function is terminated (S107: YES), it is determined whether the value of N has been changed in the operation S105 (S108). That is, it is determined whether the value of N is the default value. If the value of N has not been changed (S108: NO), the process is terminated without change. If the value of N has been changed (S108: YES), the value of N is reset to the default value (S109), and subsequently the process is terminated.

According to the interruption process, for example, when an instruction to allow the image reading section 20 to perform the scanning process is issued during the duplex printing operation, the number of sheets N to be successively printed on one side is changed to be equal to or less than the default value. Therefore, the memory area reserved for the duplex printing operation decreases, and the memory area available for the scanning process increases. Accordingly, during the scanning process, the lack of available memory is less likely to occur. On the other hand, although the duplex printing operation is performed at low speed, the operation is not stopped. Therefore, operations of both functions (duplex printing operation and scanning process) can be executed concurrently.

[Panel Interruption Process]

Figure 7:
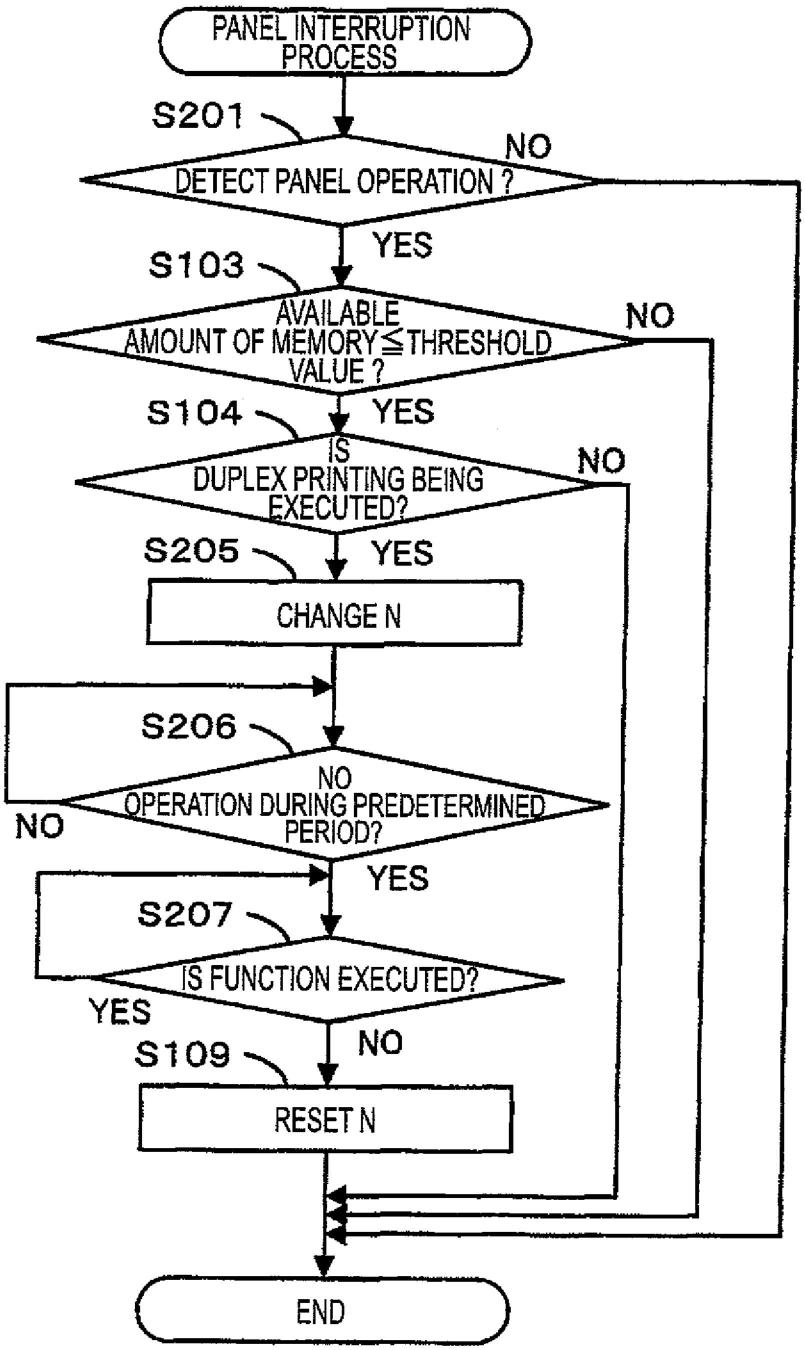
FIG. 7 is a flowchart illustrating a procedure of a panel interruption process.

Hereafter, the panel interruption process in the printer 100 will be described with reference to the flowchart of FIG. 7. The printer 100 executes the panel interruption process at a predetermined interval. In FIG. 7, the operations common to the above-described interruption process will be represented by the same reference numbers shown in FIG. 5.

First, it is determined whether an input operation using the operation panel 40 is detected (S201). If the input operation using the operation panel 40 is not detected (S201: NO), it is not necessary to change the value of N to be smaller, and therefore this process is terminated.

If the input operation using the operation panel 40 is detected (S201: YES), it is determined whether an available amount of memory is equal to or less than a threshold value (S103). If the available amount of memory is larger than the threshold value (S103: NO), it is not necessary to change the value of N to be smaller, and therefore this process is terminated. In contrast, if the available amount of memory is equal to or less than the threshold value (S103: YES), it is determined whether the duplex printing operation is being executed (S104). If the duplex printing operation is not being executed (S104: NO), it is not necessary to change the value of N to be smaller, and thereof this process is terminated.

If the duplex printing operation is being executed (S104: YES), the value of N is to be changed to be smaller than the default value (S205). The panel interruption process is a process in the panel operation which is performed before an instruction to execute a particular function is input, and therefore a function to be executed has not been determined yet. Therefore, the value of N is changed into one fixed value which is set in advance. However, if the function to be executed is specified based on a condition (for example, in a case where the operation screen of the operation panel 40 is different for each function), a different value may be set to the value of N in accordance with the condition.

After the value of N is changed, it is determined whether a predetermined time has elapsed without any operation using the operation panel 40 (S206). If the predetermined time has not elapsed (S206: NO), the process is queued until the predetermined time has passed. If the predetermined time has elapsed (S206: YES), it is determined whether the function which can be executed concurrently with the printing operation is being executed (S207). If the function which can be executed concurrently with the printing operation is being executed (S207: YES), the process is queued until the execution of the function is terminated. If the function which can be executed concurrently with the printing operation, is not executed (S207: NO), the value of N is reset to the default value (S109), and then the process is terminated.

In the panel interruption process, before the instruction to execute the function which can be executed concurrently with the printing operation is issued, the value of N is changed ahead of the execution of the function. Therefore, the memory for executing the corresponding function can be reliably reserved from the time of the start of the execution. Furthermore, since the change is made at the timing of the operation to the operation panel 40, it has not been determined whether the instruction to execute the function is actually issued. Therefore, after elapse of the predetermined time from the last operation, when the function which can be executed concurrently with the printing operation is not executed, the value of N is reset to the default value. Thereby, the adverse effect on the duplex printing is reduced.

As described above, the printer 100 according to this illustrative embodiment is capable of performing the duplex printing including printing N sheets on first sides thereof and subsequently printing M sheets ($M \leq N$) on second sides thereof, and is also capable of changing the value of N. In addition, during the duplex printing operation, the value of N is set to be smaller in response to the detection of a request for storing data which is different from the print data and shares the memory area with the print data. For example, a request for the scanning operation, the operation of transmitting/ receiving FAX data, or the operation to the operation panel 40 which is a preparation for executing a function is regarded as the request for storing data Accordingly, it is possible to reduce the amount of memory used in the duplex printing process, and it is possible to increase the amount of storage available for the process other than the printing process. That is, while the memory is not used for another process, the high-speed duplex printing is performed by setting the value of N to be large. Whereas, when the memory is intended to be used in another process, the available amount of memory can be reserved while performing the low-speed duplex printing by setting the value of N to be small.

While the present invention has been shown and described with reference to certain illustrative embodiments thereof, it will be understood by those skilled in the art that various changes in form and details may be made therein without departing from the spirit and scope of the invention as defined by the appended claims.

For example, the present invention is not limited to the color printer, and may be applied to a multi function peripheral, a FAX device, and the like if it has the image forming function. Furthermore, the image formation method of the image forming section is not limited to the electrophotographic method, and may be an inkjet method. In addition, the image forming section may form a color image, or form only a monochrome image.

Further, in the above-described illustrative embodiment, a plurality of sheets are successively printed on first sides thereof, and subsequently the same number of sheets are printed on the second sides thereof. However, after the plurality of sheets are printed on the first sides thereof, printing may be performed alternately on the second sides and on the first sides. For example, when the number of sheets to be successively printed is 2, the first sheet is printed on the second side thereof, the first sheet is discharged to the sheet discharging tray 92, and the third sheet S3 is conveyed into the forward conveying path 11, and is printed on the first side (step A). At this time, the second sheet S2 is staying in the reverse conveying path 12, and is not returned to the forward conveying path 11. Thereafter, the sheet S3 is conveyed into the reverse conveying path 12, and the second sheet S2 is returned to the forward conveying path 11, and is printed on the second side (step B). Then, steps A and B are repeated. For example, in a case where four sheets are printed on both sides, the printing is performed in order of the first side of the first sheet, the first side of the second sheet, the second side of the first sheet, the first side of the third sheet, the second side of the second sheet, the first side of the fourth sheet, the second side of the third sheet, and the second side of the fourth sheet. The present invention may be applied to this printing order.

The number of sheets M to be successively printed on the second sides may be equal to or less than the number of sheets N to be successively printed on the first sides. For example, at first, the three sheets may be successively printed on the first sides. Thereafter, the second side printing and the first side printing may be alternately performed by two sheets by two sheets.

The trigger of the operation of the printing process is not limited to the printing instruction issued from the external device 200, and may be a printing instruction which is issued from the printer 100 in response to the copying instruction and the like. Furthermore, the trigger may be the cause of receiving FAX data through the FAX interface 37.

The present invention provides illustrative, non-limiting embodiments as follows:

(1) An image forming apparatus comprises: a storage section configured to store data; a printing section configured to perform duplex printing of the data stored in the storage section, the duplex printing including printing N sheets on first sides thereof and subsequently printing M sheets on second sides thereof, wherein M is equal to or smaller than N; a detection section configured to detect a request for storing data in the storage section; and a changing section configured to change the value of N into a smaller value during the duplex printing, in response to the detection of the request for storing data based on a function which uses the storage section concurrently with an operation of the duplex printing.

The above-described image forming apparatus is capable of performing duplex printing including printing N sheets on first sides thereof and subsequently printing M sheets (M≤N) on second sides thereof "N" is a positive integer, and "M" is an integer equal to or more than 0 and equal to or less than N. Depending on the value of "N", the number of sheets staying in the apparatus as the standby of the printing on the second sides after the printing of the first sides is determined. The image forming apparatus is capable of changing the numbers of sheets N and M to be printed on their respective sides in the conveyable range. In an original condition, the value of N is determined to be a value for giving priority to the high-speed duplex printing, that is, 2 or more. In the above-described image forming apparatus, during the duplex printing operation, the value of N is changed into a smaller value in response to the detection of the request for storing data based on the function that uses (shares) the storage section (the memory) with the printing operation. The "function that uses (shares) the storage section with the printing operation" corresponds to, for example, scanning of the original document, transmission/reception of electronic mails, and transmission/reception of FAX data.

That is, in the above-described image forming apparatus, during the duplex printing operation, the value of N is set to be smaller in response to the detection of the request for storing data based on a process other than the printing process. Therefore, it is possible to reduce the amount of memory used in the duplex printing process, and it is also possible to increase the available amount of memory for the process other than the printing process. That is, while the memory is not used in a process other than the printing process, the high-speed duplex printing is performed by setting the value of N to be large. Whereas, when the memory is intended to be used in a process other than the printing process, the available amount of the memory can be reserved while performing low-speed duplex printing by setting the value of N to be small. Accordingly, it can be expected to increase duplex printing speed while suppressing load in a process other than the printing process.

(2) The above-described image forming apparatus may further comprise a reading section configured to read an original document. The request for storing data may be based on an operation of storing data read by the reading section in the storage section. In this configuration, it is possible to reduce load on the scanning process caused by the printing process when receiving a request for execution of a function including a scanning process, such as a function ("scan PC function") for performing, as a series of operations, Fax transmission, copying, reading of the original document, and transmission of the read image data to the PC.

(3) In the above-described image forming apparatus, the detection section may detect, as the request, at least a part of operation for executing the function which uses the storage section concurrently with the operation of the duplex printing being performed. The "operation for executing the function" corresponds to, for example if it is possible to issue an instruction to execute the function from an operation panel, an input operation using the operation panel (which is not limited to the operation for the final instruction of the execution, but may be an operation for setting parameters or an operation for updating the parameters by inputting those on the screen, that is, a part of an operation including the operation for the final instruction of the execution). According to the above-described image forming apparatus, control of duplex printing is changed before the execution of the function that shares the memory with the printing operation. As a result, it is possible to reserve the memory area available for the execution of the corresponding function from the start of the execution of the corresponding function.

(4) In the above-described image forming apparatus, the changing section may change the value of N into smaller value as an amount of storing data in the request is larger. By setting the amount of change in the value of N to be variable, it is possible to change the value of N to be a more appropriate value in accordance with the amount of storage (the amount of memory) required.

(5) In the above-described image forming apparatus, the changing section may return the value of N to an original value when the function related to the request finishes using the storage section. In other words, when the operation for executing the function that shares the memory with the printing operation is terminated, it is advantageous to perform the high-speed duplex printing by resetting the value of N to an original (default) value (that is, by setting the value of N to be large).

(6) In the above-described image forming apparatus, if an available amount of the storage section is larger than a threshold value, the changing section may not change the value of N even when the request for storing data is detected. When the available amount of the storage section is sufficient, even if the value of N is not changed, it has less influence on other functions. Therefore, it is advantageous to maintain high-speed duplex printing without changing the value of N.

(7) An image forming apparatus comprises: a reading section configured to read an original document; a storage section configured to store at least one of data read by the reading section and data received from an external device; a printing section configured to perform duplex printing of the data stored in the storage section, the duplex printing including printing N sheets on first sides thereof and subsequently printing M. sheets on second sides thereof, wherein M is equal to or smaller than N; a changing section configured to change the value of N into a smaller value during the duplex printing, in response to that at least a part of operation for executing reading operation by the reading section is performed; and a control section configured to control the printing section to perform the duplex printing in accordance with the value of N.

What is claimed is:

1. An image forming apparatus comprising:

a storage section configured to store data;

a printing section configured to perform duplex printing of the data stored in the storage section; and a control device configured to:

control the printing section to perform duplex printing based on the data, which prints N sheets on first sides thereof and subsequently prints M sheets among the printed N sheets on second sides thereof, wherein M is equal to or smaller than N;

detect a request for storing data in the storage section;

change a value of N into N' which is smaller than N, during the duplex printing, in response to the detection of the request for storing data based on a function which uses the storage section concurrently with an operation of the duplex printing; and control the printing section to continue the duplex printing based on the data, which prints N' sheets on first side thereof and subsequently prints M' sheets among the printed N' sheets on second sides thereof, wherein M' is equal to or smaller than N'.

2. The image forming apparatus according to claim 1, further comprising:

a reading section configured to read an original document, wherein the request for storing data is based on an operation of storing data read by the reading section in the storage section.

3. The image forming apparatus according to claim 1, wherein the control device detects, as the request, at least a part of operation for executing the function which uses the storage section concurrently with the operation of the duplex printing being performed.

4. The image forming apparatus according to claim 1, wherein the control device changes the value of N into smaller value as an amount of storing data in the request is larger.

5. The image forming apparatus according to claim 1, wherein the control device returns the value of N to an original value when the function related to the request finishes using the storage section.

6. The image forming apparatus according to claim 1, wherein if an available amount of the storage section is larger than a threshold value, the control device does not change the value of N even when the request for storing data is detected.

7. The image forming apparatus according to claim 6, wherein the threshold value is a fixed value stored in advance.

8. The image forming apparatus according to claim 6, wherein the threshold value is a value determined based on the function related to the request.

9. An image forming apparatus comprising:

a reading section configured to read an original document;

a storage section configured to store at least one of data read by the reading section and data received from an external device;

a printing section configured to perform duplex printing of the data stored in the storage section;

a control device configured to:

control the printing section to perform duplex printing based on the data, which prints N sheets on first sides thereof and subsequently prints M sheets among the printed N sheets on second sides thereof, wherein M is equal to or smaller than N;

change a value of N into N' which is smaller than N, during the duplex printing, in response to at least a part of an operation for executing reading an original document by the reading section is performed; and control the printing section to continue the duplex printing based on the data, which prints N' sheets on first side thereof and subsequently prints M' sheets among the printed N' sheets on second sides thereof, wherein M' is equal to or smaller than N'.

10. An image forming apparatus comprising:

a storage section configured to store data;

a printing section configured to perform duplex printing of the data stored in the storage section, the duplex printing including printing images on first and second sides of a plurality of sheets;

and a control device configured to:

control the printing section to perform duplex printing based on the data, which prints N sheets on first sides thereof and subsequently prints M sheets among the printed N sheets on second sides thereof, wherein M is equal to or smaller than N;

detect a request for storing data in the storage section;

change a value of N into N' which is smaller than N, during the duplex printing, in response to the detection of the request for storing data during the printing of images, the request being based on a function which uses the storage section concurrently with an operation of the duplex printing; and control the printing section to continue the duplex printing based on the data, which prints N' sheets on first side thereof and subsequently prints M' sheets among the printed N' sheets on second sides thereof, wherein M' is equal to or smaller than N'.

* * * * *